United States Patent [19]

Schlamp et al.

[11] Patent Number: 4,943,362

[45] Date of Patent: Jul. 24, 1990

[54] SPUTTERING TARGET FOR PRODUCING OPTICALLY TRANSPARENT LAYERS AND METHOD OF MANUFACTURING THESE TARGETS

[75] Inventors: Guenther Schlamp, Steinbach; Klaus P. Gall; Adolf Langer, both of Rodenbach; Georg Ptaschek, Rosbach, all of Fed. Rep. of Germany

[73] Assignee: Demetron Gesellschaft Fuer Elektronik-Werkstoffe m.b.H., Hanau, Fed. Rep. of Germany

[21] Appl. No.: 195,845

[22] Filed: May 19, 1988

[30] Foreign Application Priority Data

May 20, 1987 [DE] Fed. Rep. of Germany ....... 3716852

[51] Int. Cl.$^5$ ........................ C23C 14/34; C03C 17/09
[52] U.S. Cl. ............................... 204/298.13; 75/228; 204/192.27; 419/38; 419/41
[58] Field of Search ................. 204/298 TC, 298 TS, 204/192.26, 192.27, 192.28, 298.13; 419/38, 41; 75/245, 228

[56] References Cited

U.S. PATENT DOCUMENTS 4,610,771  9/1986  Gillery .............................. 204/192.1

OTHER PUBLICATIONS

John L. Vossen et al., Thin Film Processes, Academic Press, 1978, New York, pp. 41–42.

*Primary Examiner*—John F. Niebling
*Assistant Examiner*—William Leaden
*Attorney, Agent, or Firm*—Beveridge, DeGrandi & Weilacher

[57] ABSTRACT

Sputter targets of bismuth with 0.2 to 10% by weight manganese for producing optically transparent surface layers which reflect heat in combination with silver layers on panes of glass and of plastic achieve an improved resistance to UV in silver layers if the manganese is present in the form of the intermetallic compound BiMn in an even, finely dispersed distribution within the metallic bismuth matrix.

12 Claims, No Drawings

SPUTTERING TARGET FOR PRODUCING OPTICALLY TRANSPARENT LAYERS AND METHOD OF MANUFACTURING THESE TARGETS

INTRODUCTION AND BACKGROUND

The present invention relates to a sputtering target for producing optically transparent surface layers in combination with silvered heat reflecting layers on transparent substrates such as panes of glass and of transparent plastic. The sputtering target is formed of bismuth with 0.2 to 10% by weight manganese. In a further aspect, the present invention relates to a method of manufacturing these sputter targets and substrates produced using these novel sputtering targets.

It is known that architectural panes of glass and transparent plastic foils can be provided with thin, optically transparent layers of silver by means of coating in order to obtain a more intense reflection of heat radiation. This achieves both a protection against excessive radiation of heat into the building from the outside as well as also reduced energy losses in heated buildings due to heat radiation from the inside to the outside. Often, combinations of several layers on the glass panes are used to this end. Thus, three-layer arrangements have proven to be particularly useful which consist of a metal oxide adhesive layer, a silver layer reflecting infrared radiation and a top antireflection layer of metal oxide.

In general, the method of cathodic atomization in a glow discharge, called sputtering, is used for the manufacture of such layers. For this, the metals, metal alloys and metal oxides to be applied as layers are used as specially shaped solid-state bodies, e.g. plates, rings or also parts of a more complex geometry — the so-called targets.

The atomization (sputtering) occurs by the process of charged gas atoms striking the target surface, as a result of which individual atoms or atom groups are dislodged from the target surface. These dislodged atoms then strike the opposing surface of the glass to be coated, where they form corresponding surface layers. The method is normally carried out in an atmosphere of noble (inert) gas, e.g. argon, under reduced pressure with applied electric voltages or high-frequency alternating currents (RF) in a direct current (DC) or high-frequency alternating current circuit.

If amounts of oxygen or nitrogen are additionally added to the noble gas atmosphere, oxide or nitride layers can also be formed, depending on the type of metal of the target. For example, adhesive oxide layers and antireflection oxide layers can be manufactured with this method using metallic targets. Usually, bismuth targets are used for this and bismuth oxide layers are applied.

It is known that pure bismuth oxide layers in direct contact with silver layers cause a blackening or darkening under UV radiation. This can be avoided if other metal oxide layers which do not cause a blackening under Uv radiation are applied between the silver layer and the bismuth oxide layers. Known examples are lead oxide, indium oxide or indium tin oxide.

German Patent No. 32 11 753 shows sputter targets for producing optically transparent surface layers of bismuth oxide which reflect heat in combination with silver layers on transparent material such as glass panes and plastic foils which consist of bismuth with 0.2 to 10% by weight manganese. However, no data is presented about the design and the manufacture of these targets.

When these known sputter targets of bismuth with 0.2 to 10% by weight manganese are used, which are manufactured by pressing and optionally by sintering an appropriate powder mixture of bismuth and manganese, manganese oxide-containing bismuth oxide layers are produced during sputtering in an oxygen-containing atmosphere of noble gas which suppress the blackening of silver layers under UV radiation. However, it has been observed that a gradual blackening of the silver layer does occur under a long-lasting action of UV radiation.

SUMMARY OF THE INVENTION

The invention therefore has the object to provide sputter targets for producing optically transparent surface layers which reflect heat in combination with silver layers on transparent material such as panes of glass and of plastic, consisting of bismuth and 0.2 to 10% by weight manganese in such a manner that no perceptible blackening or darkening of the silver layer occurs even in the case of a long-lasting action of UV radiation. To provide transparent substrates coated in accordance with using these sputtering targets is another object of the invention. In addition, a method of manufacturing these sputter targets is a further object of the invention.

In attaining the above and other objects, a feature of the invention resides in the manganese being present in the form of the intermetallic compound BiMn in an even, finely dispersed particulate distribution within the metallic bismuth matrix.

It is advantageous if these BiMn particles exhibit a diameter of less than or equal to 10 $\mu$m. Moreover, the metallic bismuth matrix should exhibit particle sizes of up to a maximum of 200 $\mu$m, preferably particle sizes of 10 to 100 $\mu$m. The particles of the matrix to the greatest extent possible should exhibit no preferred crystallographic orientation.

It has proven to be advantageous for the stabilizing of the reactively performed sputtering process under the addition of slight, defined amounts of oxygen if a certain oxygen content is already present in the targets. However, this content should not exceed 2000 ppm. Oxygen contents in the Bi-BiMn targets below 1000 ppm, especially between 500 ppm and 800 ppm, have proven to be optimal. Moreover, the target matrix should exhibit a difference in density of ±1% at the most of the average target density over its entire dimension.

It was surprisingly found that in the case of sputtered, manganese-containing bismuth oxide layers a lasting suppression of the blackening of silver layers that are in direct contact with them succeeds if the manganese is present in the metallic bismuth targets used for reactive sputtering in the form of a defined BiMn compound distributed in a finely dispersed manner within the bismuth-metal matrix. Targets which were manufactured from powder mixtures of elementary bismuth and manganese by pressing and sintering can be sputtered with no problems; however, the bismuth-manganese oxide layers produced therefrom result in a gradual blackening of the silver layers that are in direct contact with them when exposed to Uv radiation over a long period of time.

Magnetic fields are generated within the glow discharge for the coating according to the sputtering process in order to intensify the speed of layer formation.

These magnetic fields concentrate the argon ions required for removing the target material in certain surface areas of the target. In order to generate these magnetic fields, magnets are placed under the target, that is, on the side of the target on which it is fastened to the carrier or back plate. This device normally functions only if the target material itself is non-magnetic. In the case of ferromagnetic target material, the intensifying action by magnetic fields in this manner can only be achieved if the target matrix is only slightly magnetic. Moreover, no inhomogeneously distributed magnetic areas may be present in the target matrix in the case of targets with multiphase, heterogeneous structures since these areas weaken the magnetic fields generated and bring about therewith a locally uneven removal of the target. Locally different layer densities arise in this manner on the substrates to be coated.

The general technology of sputtering is well known and applies in accordance with the present invention.

The BiMn compound, which is used according to the invention with particular advantage instead of elementary Mn, is ferromagnetic, in contrast to the latter. It is therefore especially important for targets consisting of manganese-containing bismuth in which the manganese is present in the form of the BiMn compound when using the sputtering process intensified by magnetic fields that the BiMn compound is present in the form of extremely small particles, e.g. smaller than 1 μm, and that the latter are distributed evenly without local accumulations or depleted areas within the matrix.

The sputter targets of the invention can be manufactured by mixing, compressing and optionally sintering bismuth powder with previously thoroughly reacted BiMn powder (Bi : Mn =1 : 1). The BiMn particles should exhibit a particle size of at most 10 μm and the bismuth particles a particle size of 200μm at most. However, it is preferable to use powders which were produced by atomizing a molten bismuth-manganese alloy in a vacuum or in an atmosphere of inert gas. These powders are first compressed by means of isostatic pressing, then the compacts are sintered at temperatures under 260° C. and subsequently processed by means of extrusion to target blanks with an average density of over 99% of the theoretical density.

DETAILED DESCRIPTION OF INVENTION

The following examples are intended to explain the invention in more detail:

1. A molten alloy of bismuth with 1% by weight manganese is atomized to powder in an argon atmosphere. After the particles larger than 200 μm in diameter have been sieved off, the remaining bulk, which exhibits a particle size of less than or equal to 200 μm, is isostatically compressed at a pressure of 200 MPa to a round bar. The blank exhibits thereafter a density greater than 96% of the theoretical density at an average particle size of approximately 60 μm. The BiMn compound is distributed in a finely dispersed manner in these particles with a standard size of 1 - 10 μm. A heat treatment is subsequently performed in a nitrogen atmosphere at 250° C. over a period of two hours. Then the bar is pressed by means of extrusion to flat target blanks. The density of the material is then 99% of the theoretical density. With these targets, there is obtained after sputtering satisfactory uniform, Mn-containing bismuth oxide layers, which layers do not undergo any blackening when in direct contact with silver layers under long periods of Uv radiation.

2. Atomized bismuth-metal powder with particle sizes of less than or equal to 200 μm and mechanically comminuted BiMn compound bits with particle sizes less than or equal to 10 μm are mechanically mixed and subsequently isostatically pressed to a round bar, whereby a pressure of 200 MPa is used. Thereafter, the blank exhibits a density of approximately 88% of the theoretical density. A compacting to approximately 92% of the theoretical density is brought about by a subsequent sintering at 255° C. Shaping to target blanks which then exhibit a density of 98 - 99% is then performed by extrusion at 150° C. These targets yield satisfactory coating results and cause no blackening when in direct contact with silver layers under long periods of Uv radiation.

Further variations and modifications of the foregoing will be apparent to those skilled in the art and are intended to be encompassed by the claims appended hereto.

We claim:

1. A sputter target for producing optically transparent surface layers which reflect heat, in combination with a layer of silver on a transparent substrate, said target consisting essentially of bismuth with 0.2 to 10% by weight manganese, characterized in that the manganese is present in the form of the intermetallic compound BiMn in even, finely dispersed particles distributed within a matrix of metallic bismuth particles.

2. The sputter target according to claim 1, wherein the BiMn particles exhibit a diameter of less than or equal to 10 μm.

3. The sputter target according to claim 1, wherein the particles of the metallic bismuth matrix exhibit particle sizes of less than or equal to 200 μm.

4. The sputter target according to claim 1, wherein the particles of the bismuth matrix exhibit particle sizes of 10 to 100 μm.

5. The sputter target according to claim 1, wherein the particles of the bismuth matrix display no preferred crystallographic orientation.

6. The sputter target according to claim 1, wherein the target material exhibits an oxygen content which is not above 2000 ppm.

7. The sputter target according to claim 7, wherein the oxygen content of the target material is under 1000 ppm.

8. The sputter target according to claim 1, wherein the target matrix exhibits a difference in density of ±1% at the most of the average target density over its entire dimension.

9. A method of manufacturing sputter targets for producing optically transparent surface layers which reflect heat, in combination with a layer of silver on a transparent substrate, said method comprising mixing finely divided bismuth powder with finely divided BiMn powder to form a uniform admixture and compressing said admixture to form a shaped target body.

10. A method according to claim, wherein the compressed admixture is sintered.

11. The method according to claim 10, wherein the sintering takes place below 260° C.

12. The method according to claim 11, wherein the product of the sintering step is subsequently processed further by means of extrusion to moulded bodies with an average density of over 99% of the theoretical density.

* * * * *